United States Patent
Kaji et al.

[19]

[11] Patent Number: 6,144,680
[45] Date of Patent: *Nov. 7, 2000

[54] LASER DRIVING APPARATUS AND IMAGE FORMING APPARATUS USING THE SAME

[75] Inventors: Hajime Kaji, Shizuoka-ken, Japan; Tomobumi Nakayama, deceased, late of Tokyo, Japan, by Kazumi Nakayama, legal representative; Michiharu Masuda; Takayuki Kawakami, both of Numazu, Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/114,512

[22] Filed: Jul. 14, 1998

[30] Foreign Application Priority Data

Jul. 15, 1997 [JP] Japan .................................. 9-189635

[51] Int. Cl.$^7$ ........................................................ H01S 3/00
[52] U.S. Cl. .................................. 372/38; 372/29
[58] Field of Search ......................................... 372/38, 29

[56] References Cited

U.S. PATENT DOCUMENTS 5,822,346 10/1998 Arai .......................................... 372/38
5,887,010 3/1999 Arai .......................................... 372/38

Primary Examiner—Leon Scott, Jr.
Attorney, Agent, or Firm—Fitzpatrick, Cella, Harper & Scinto

[57] ABSTRACT

A laser driving apparatus for driving a plurality of laser beam sources includes a plurality of laser beam sources, a photodetector for detecting amounts of laser beams emitted from the plurality of laser beam sources, a plurality of current sources for driving the plurality of laser beam sources, a plurality of switches respectively interposed between the plurality of laser beam sources and the plurality of current sources, a plurality of controllers for controlling light amounts of the plurality of laser beam sources by comparing the light amounts detected by the photodetector with a reference value and controlling current amounts of the plurality of current sources in accordance with the comparison values, a plurality of sample/hold circuits respectively interposed between the photodetector and the plurality of controllers, and timing adjustment device for outputting a plurality of timing signals of a first type for controlling the plurality of switches and a plurality of timing signals of a second type for controlling the plurality of sample/hold circuits. The timing adjustment device outputs the plurality of timing signals of the first type for time-divisionally turning on the plurality of switches and sequentially making the plurality of laser beam sources to emit laser beams one by one. The plurality of timing signals of the second type making each of the plurality of sample/hold circuits corresponding to the plurality of switches sample while each of the plurality of switches is on. The plurality of timing signals of the second type making each of the plurality of sample/hold circuits sample while any one of the switches which are turned on before a corresponding switch is on.

12 Claims, 5 Drawing Sheets

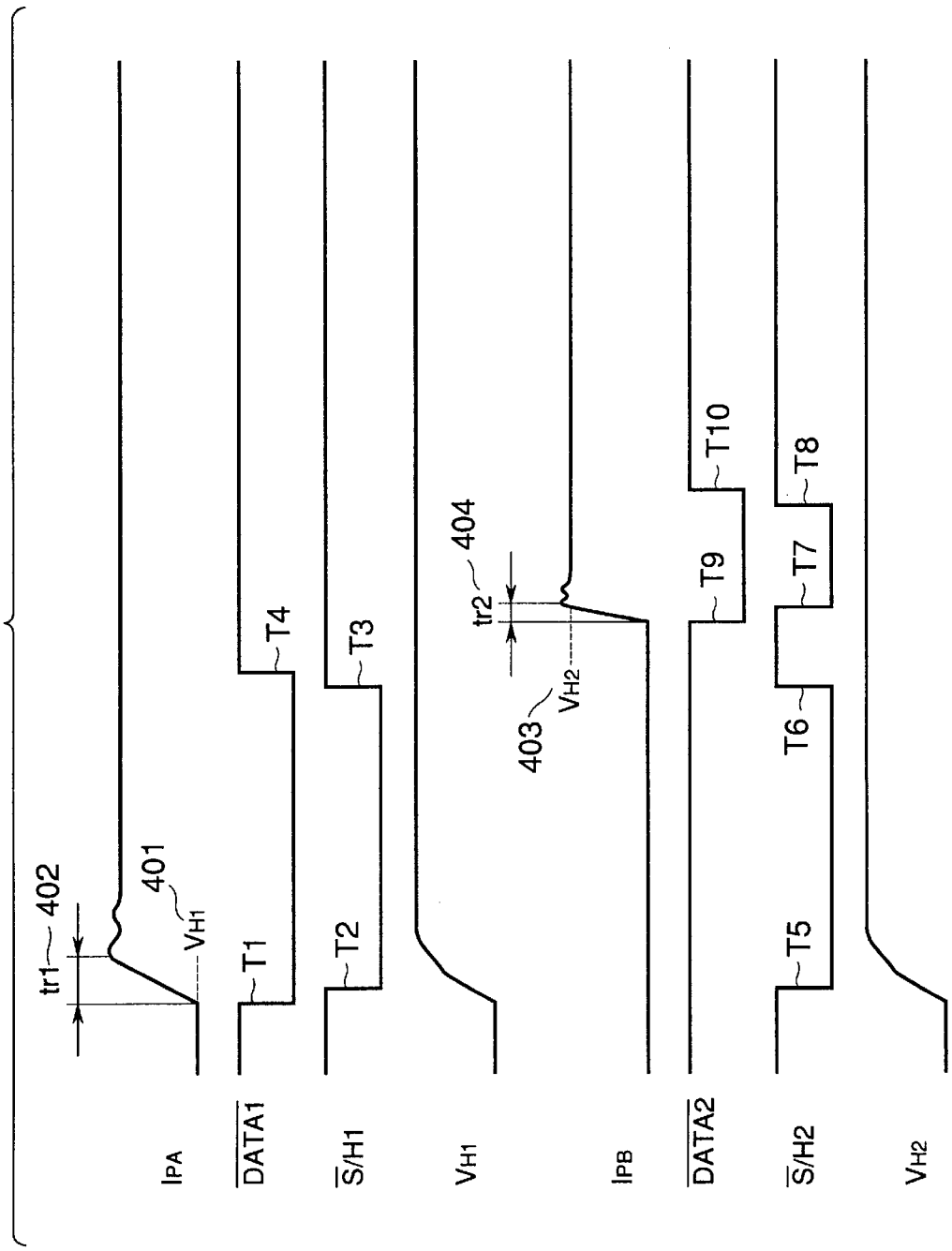

LASER DRIVING APPARATUS AND IMAGE FORMING APPARATUS USING THE SAME

BACKGROUND OF THE INVENTION

1. Field of the Invention

The present invention relates to an image forming apparatus and a laser driving apparatus used in the image forming apparatus and, more particularly, to an image forming apparatus, suited to a copying machine, a laser beam printer, a facsimile, and the like, which guides an optically modulated laser beam from a laser beam source onto an image carrier such as an electrostatic recording medium so as to form an image, e.g., an electrostatic latent image, on the surface of the image carrier, and a laser driving apparatus used in the image forming apparatus. The present invention also relates to a copying machine, a laser beam printer, a facsimile, and the like using these apparatuses.

2. Related Background Art

A conventional image forming apparatus of this type uses a one-chip element such as a laser chip having a laser beam source, e.g., one laser diode, and a photodetector, e.g., one photodiode (PD) sensor. The image forming apparatus also has a pulse current source for driving the laser diode. In this apparatus, laser emission is stabilized as follows. Negative feedback for the pulse current source is done using a detection output signal from the PD sensor that has detected a laser beam, thereby controlling the pulse current amount and setting the laser beam amount to a predetermined value (this control will be referred to as APC hereinafter).

An image forming apparatus using a multilaser unit having a plurality of laser beam sources exploits this arrangement and uses an APC circuit having an arrangement similar to that shown in FIG. 1. FIG. 1 shows the internal arrangement of a semiconductor laser chip 201 in an optical system used for the image forming apparatus shown in FIG. 2. Referring to FIG. 1, the semiconductor laser chip 201 is a twin laser chip formed by an A laser (LD-A) 302, a B laser (LD-B) 303, and a PD sensor (PD) 304. A pulse current source 305 is used for the A laser 302, and light emission by the A laser 302 is ON/OFF-controlled by a switch 307 that is turned on/off in accordance with an image data signal DATA 1 output from an image processing section 316. Similarly, a pulse current source 306 is used for the B laser 303, and light emission by the B laser 303 is ON/OFF-controlled by a switch 308 that is turned on/off in accordance with an image data signal DATA 2 output from the image processing section 316.

The current output from the PD sensor 304 upon detection of a laser beam is converted into a voltage signal by a current/voltage converter (I/V) 309. This voltage signal is input to an operational amplifier 315 through a sample-and-hold (S/H) circuit 311 to be compared with a reference voltage Vrefl (313). The pulse current source 305 is controlled in accordance with an output voltage $V_{H1}$ from the operational amplifier 315. The output signal from the PD sensor 304 is also input to an operational amplifier 314 through the I/V converter 309 and an S/H circuit 310 to be compared with a reference voltage Vref2 (312). The pulse current source 306 is controlled in accordance with an output voltage $V_{H2}$ from the operational amplifier 314. The reference voltages 312 and 313 are target values for controlling the respective pulse current sources. The S/H circuits 311 and 310 are controlled in accordance with sample/hold signals S/H1 Sig and S/H2 Sig output from the image processing section 316.

Referring to FIG. 1, the image forming section 316 generates the aforementioned image data DATA 1 and DATA 2, and a system controller 317 controls the image forming section 316.

In the above multilaser unit comprised of a plurality of lasers, only one PD sensor is used. For this reason, to perform negative feedback control on the amount of pulse current for each laser, each pulse current source must be controlled after making the respective lasers emit light one by one time-divisionally.

FIG. 3 shows a conventional control sequence. First of all, the A laser 302 is driven to emit light at time T1 to control a pulse current amount $I_{PA}$ for the A laser 302. In this case, the A laser 302 is continuously turned on until its laser emission stabilizes. After the current amount $I_{PA}$ stabilizes, the pulse current is held, and the A laser 302 is temporarily turned off at time T2. The B laser 303 is then driven to emit light at time T3 to control a pulse current amount $I_{PB}$ for the B laser 303. As in the case of the A laser 302, the B laser 303 is continuously turned on until its laser emission stabilizes. After the current amount $I_{PB}$ stabilizes, the pulse current is held, and the B laser 303 is temporarily turned off at time T4. After that, the apparatus is ready to output image data.

At the start of this negative feedback control, the total time (between time t1 to time t4) required to obtain predetermined light amounts by making the lasers emit light is generally the control time per laser multiplied by the number of lasers incorporated in the multilaser unit. In an apparatus of this type, therefore, a certain preparatory time is required before image data is output. This may lead to a delay in image formation.

SUMMARY OF THE INVENTION

It is an object of the present invention to provide a laser driving apparatus which can shorten the time required to set the light amounts of a plurality of laser beams to a predetermined value and an image forming apparatus using the same.

According to the present invention, there is provided a laser driving apparatus for driving a plurality of laser beam sources, comprising a plurality of laser beam sources, a photodetector for detecting amounts of laser beams emitted from the plurality of laser beam sources, a plurality of current sources for driving the plurality of laser beam sources, a plurality of switches respectively interposed between the plurality of laser beam sources and the plurality of current sources, a plurality of control means for controlling light amounts of the plurality of laser beam sources by comparing the light amounts detected by the photodetector with a reference value and controlling current amounts of the plurality of current sources in accordance with the comparison values, a plurality of sample/hold circuits respectively interposed between the photodetector and the plurality of control means, and timing adjustment means for outputting a plurality of timing signals of a first type for controlling the plurality of switches and a plurality of timing signals of a second type for controlling the plurality of sample/hold circuits, wherein the timing adjustment means outputs the plurality of timing signals of the first type for time-divisionally turning on the plurality of switches and sequentially making the plurality of laser beam sources to emit laser beams one by one, the plurality of timing signals of the second type making each of the plurality of sample/hold circuits corresponding to the plurality of switches sample while each of the plurality of switches is on, and the plurality of timing signals of the second type making each of the plurality of sample/hold circuits sample while any one of the switches which are turned on before a corresponding switch is on.

An image forming apparatus of the present invention comprises the above laser driving apparatus.

A copying machine of the present invention comprises the above image forming apparatus.

According to the present invention, in a laser driving apparatus for driving a multilaser unit composed of a plurality of lasers, and an image forming apparatus using the same, when negative feedback control is performed on the light amount of one of the lasers, a control start voltage for the remaining lasers is obtained, and the obtained voltage is used as an initial value for negative feedback control on the light amounts of the remaining lasers, thereby shortening the time required for negative feedback control on the overall multilaser unit.

BRIEF DESCRIPTION OF THE DRAWINGS

FIG. 5 is a timing chart showing the operation timing of negative feedback control on a multilaser unit according to an embodiment of the present invention.

DESCRIPTION OF THE PREFERRED EMBODIMENT

Figure 4:
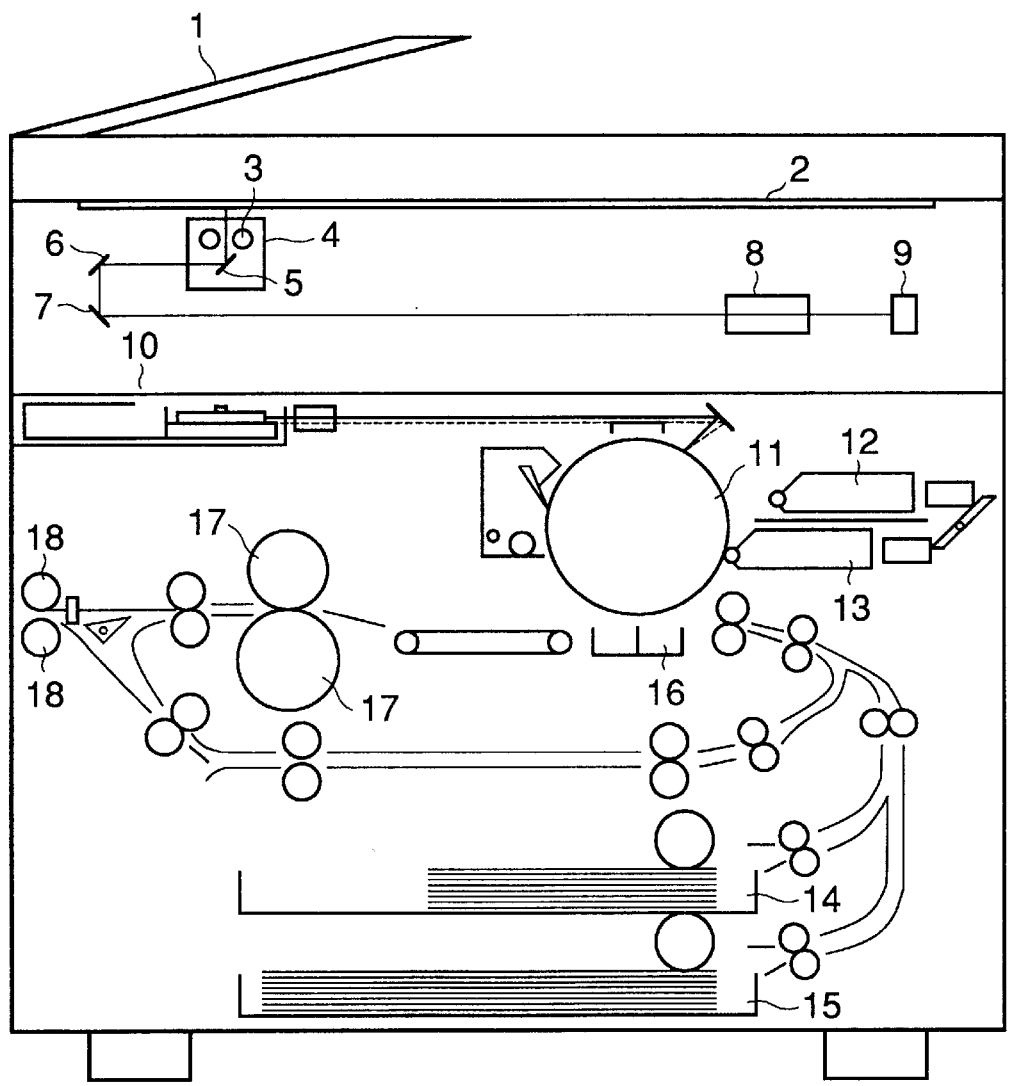
FIG. 4 is a sectional view showing the arrangement of an image processing apparatus including an image forming apparatus to which the present invention is applied.

FIG. 4 is a sectional view showing the overall arrangement of an image processing apparatus such as a copying machine comprised of an image reader and an image forming apparatus including a laser beam source controller. Referring to FIG. 4, originals placed on one document feeder 1 are sequentially conveyed onto an original table glass surface 2 one by one.

When an original is conveyed to the original table glass surface 2, a lamp at a scanner 3 is turned on, and a scanner section 4 moves in the sub-scanning direction (rightward) to irradiate the original with light. The light reflected by the original is reflected by mirrors 5, 6, and 7 and is focused by a lens 8 to be input to an image sensor section 9. The electrical image signal obtained by photoelectrically converting the input light in the image sensor section 9 is temporarily stored in an image memory (not shown) and read out to be input to an exposure control section 10. Alternatively, this signal is directly input from the image sensor section 9 to the exposure control section 10.

The exposure control section 10 drives lasers to make them emit light on the basis of the image signal. The latent image formed on a photoconductor 11 by the emitted light is developed by a developing unit 12 or 13. A transfer sheet is conveyed from a transfer paper tray 14 or 15 in accordance with the timing of the formation of the above latent image. At a transfer section 16, the developed toner image is transferred onto the transfer sheet. The toner image transferred onto the transfer sheet is fixed by a fixing section 17. The sheet is then discharged outside the apparatus by a paper discharge section 18.

Figure 2:
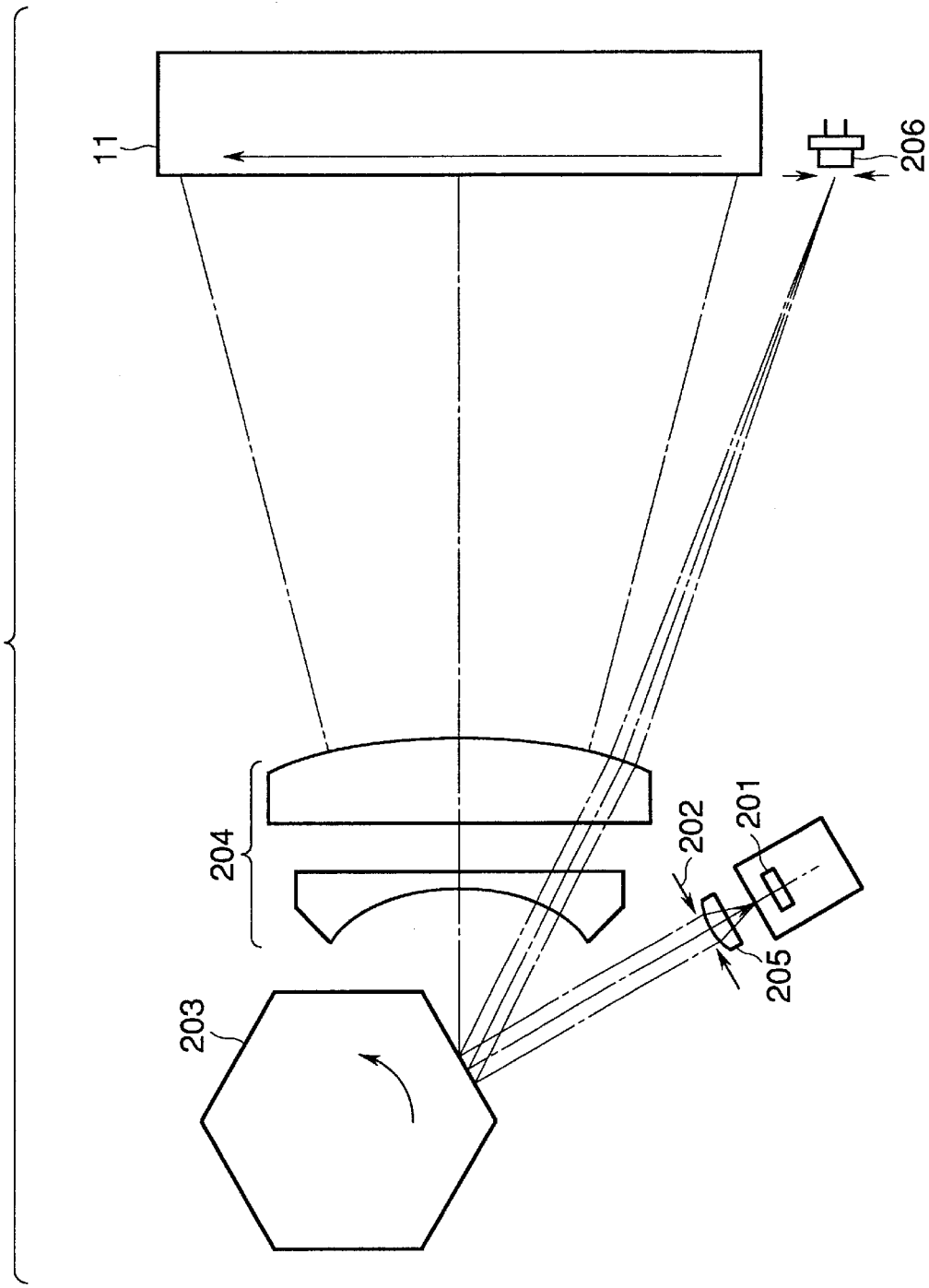
FIG. 2 is a view showing the arrangement of an optical system in an exposure control section.

FIG. 2 shows the arrangement of an optical system associated with the exposure control section 10 in FIG. 4. A plurality of light beams emitted from a semiconductor laser chip 201 are nearly collimated by a collimator lens 205 and a stop 202. The collimated light having a predetermined beam diameter is then incident on a rotating polygonal mirror 203. The rotating polygonal mirror 203 is rotating at a constant angular velocity in the direction indicated by the curved arrow in FIG. 2. With this rotation, the incident light beam is reflected as a deflected beam whose direction is continuously changed. The deflected light beam is focused by an f-θ lens 204. At the same time, the f-θ lens 204 focuses/scans the light beam on the photoconductor 11 as an image carrier at a constant velocity in the direction indicated by the straight arrow in FIG. 2 to correct any distortion so as to ensure time linearity of scanning of the deflected beam. Data is written on the photoconductor 11 by light amount control of the semiconductor laser chip 201. The semiconductor laser chip 201 is a twin laser chip constructed by an A laser (LD-A) 302, a B laser (LD-B) 303, an a PD sensor (PD) 304. A photodetector 206 is used to detect the scanning start timing.

Figure 1:
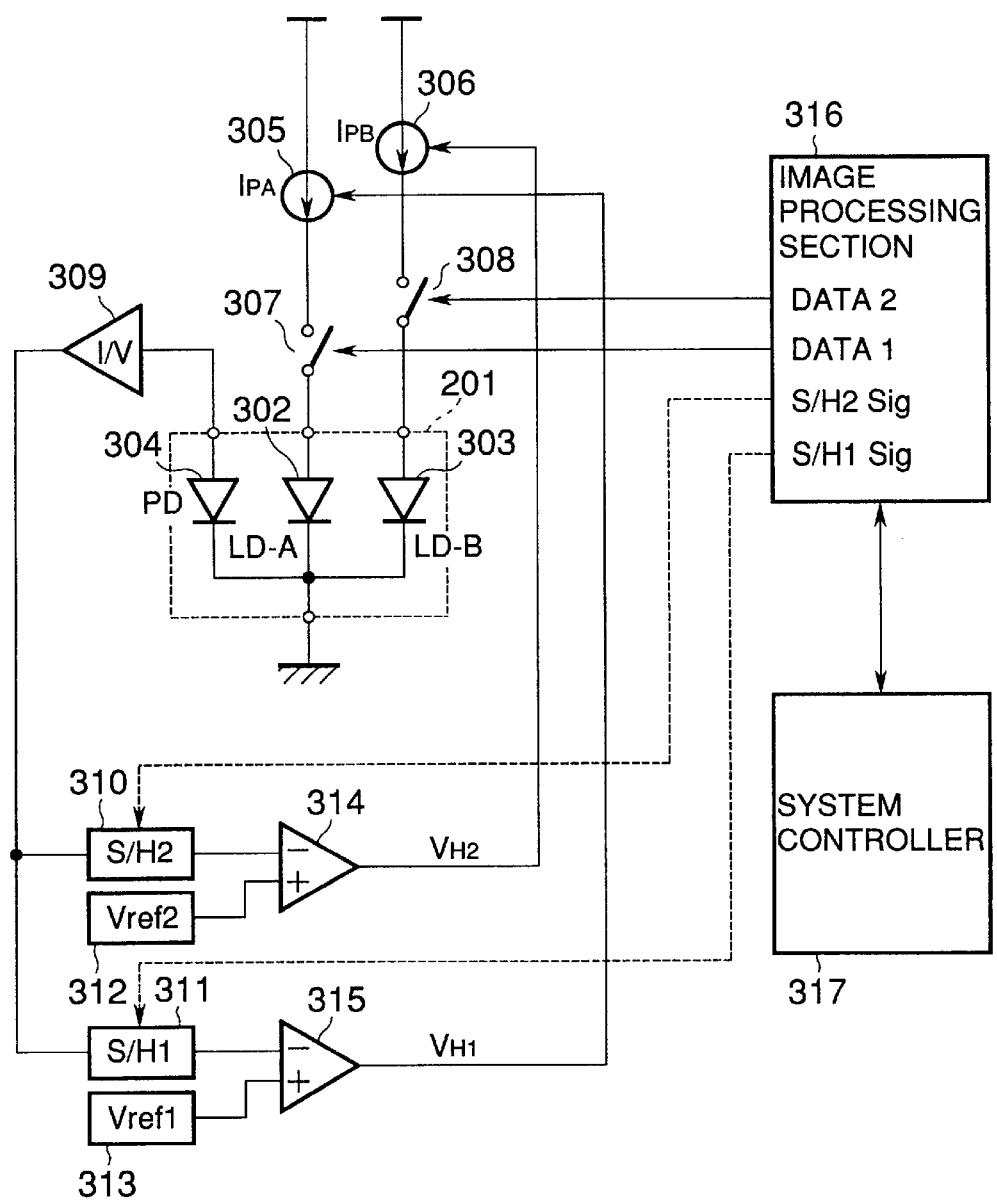
FIG. 1 is a circuit diagram showing the arrangement of a laser driving apparatus for a multilaser unit.

A laser driving circuit used for this image processing apparatus has the same arrangement as that shown in FIG. 1. This laser driving circuit is arranged in the exposure control section 10. Since the operation of the laser driving circuit is roughly the same as that in the prior art, a description thereof will be omitted.

A control sequence in the present invention will be described next with reference to FIG. 5.

First of all, a signal /DATA 1 ("/" indicates negative logic) from an image processing section 316 is set at LOW to turn on an SW 307, thereby turning on the A laser 302 to perform APC control for the A laser (time T1). Immediately after this operation, a sample/hold circuit 311 is set in the sampling state (time T2). Negative feedback control is performed while the output voltage from a current/voltage converter (I/V) 309 is compared with a target value Vref1 313. With this control, a pulse current amount $I_{PA}$ output from a pulse current source 305 to the A laser 302 is adjusted to set a target light amount. In this case, since a control start voltage $V_{H1}$ (401) has been set to 0 V, a certain period of time $t_{r1}$ (402) is required to start up the laser. After a lapse of a predetermined period of time (enough to attain a target light amount), the sample/hold circuit 311 is set in the holding state (time T3), and the input/output voltage of an operational amplifier 315 is kept constant.

Figure 3:
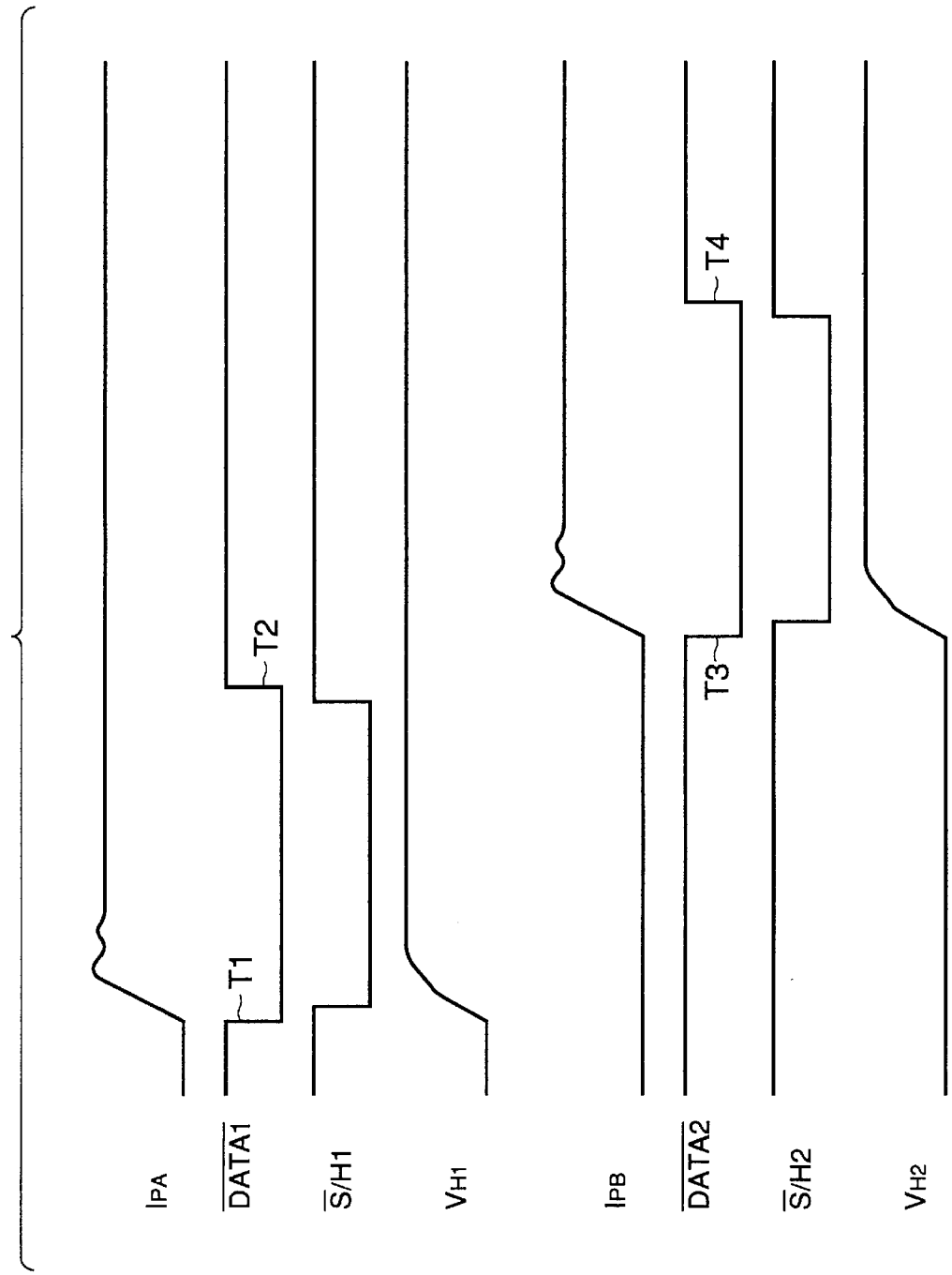
FIG. 3 is a timing chart showing the operation timing of negative feedback control on a multilaser unit in the prior art.

While sampling for the A laser is done (the interval between time T2 and time T3), no control is performed on the B laser in the prior art shown in FIG. 3. In this embodiment, however, a sample/hold circuit 310 also samples in the interval between time T5 to time T6 (equal to the interval between time T2 to time T3) to set a control start voltage $VH_2$ (403) to be equal to the voltage held when the target light amount of the A laser is obtained. In this case, a signal/DATA 2 is set at HIGH to turn off an SW 308 so as to turn off the B laser.

Since the lasers in one chip have similar characteristics, the light amount of the B laser 303 is set to be approximately equal to that of the A laser 302 within a short period of time ($t_{r2}$) by setting the control start voltage of the B laser 303 to be equal to the held voltage for the A laser 302. Thereafter, the sample/hold circuit 310 on the B laser side samples again to perform fine adjustment (in the interval between time T7 and time T8), thereby obtaining a proper light amount. After this operation, the voltage is held at time T8.

With this control, better rising characteristics can be obtained, and the time $t_{r2}$ (404) required for stabilization can be shortened. Therefore, APC control for the B laser can be completed within a short period of time.

Note that since the image processing section 316 controls the operation timing of the switches 307 and 308 and the sample/hold circuits 310 and 311, the section 316 functions as a timing adjustment means for these components.

The above control sequence for light amount adjustment in the present invention can be executed at any time except for the recording/scanning period (during which light from the light source is modulated on the basis of an image signal, and an image is formed on the photoconductor).

Since the light amount of the semiconductor laser beam source changes with environmental changes such as a change in temperature, the above control sequence for light amount adjustment is preferably performed during the period immediately before image formation (the period immediately before light from the light source is modulated on the basis of an image signal on one scanning line).

In this embodiment, two beams are used. Even if, however, three lasers or more are used, the same control as that described above can be performed. The control time can be shortened in proportion to the number of lasers used. When three lasers or more are to be used, all the sample/hold circuits corresponding to the second and subsequent lasers may be controlled to sample while the light amount of the first laser is controlled. However, the present invention is not limited to this. Irrespective of which one of the lasers before a given laser is controlled, its sample/hold circuit may sample. For example, the third sample/hold circuit may sample while the light amount of the second laser is controlled.

As described above, a laser driving apparatus for driving a plurality of laser beam sources includes a photodetector for detecting the amount of laser beam emitted from each laser beam source, a plurality of current sources for driving the plurality of laser beam sources, a plurality of switches respectively interposed between the plurality of laser beam sources and the plurality of current sources, a plurality of control means for controlling the light amounts of the plurality of laser beam sources by comparing the light amounts detected by the photodetector with a reference value and controlling the current amounts of the plurality of current sources in accordance with the respective comparison values, a plurality of sample/hold circuits interposed between the photodetector and the plurality of control means, and a timing adjustment means for outputting a plurality of timing signals for controlling the plurality of switches and the plurality of sample/hold circuits. The timing adjustment means is designed to output a timing signal by which the adjustment value obtained when the light amount of the first laser is controlled is used as the initial value to be used to control the light amount of the second and subsequent lasers.

In summary, according to the present invention, a delay in negative feedback control on laser emission can be prevented, and the time required before image formation is started can be shortened. The total time required for image formation can therefore be shortened. This can further improve the characteristics of an image forming apparatus having a multilaser unit. That is, the operation speed can be further increased.

What is claimed is:

1. A laser driving apparatus for driving a plurality of laser beam sources, comprising:

a plurality of laser beam sources selectively emitting laser beams;

a photodetector for producing a detection signal; indicative of an amount of light of the laser beams emitted from said plurality of laser beam sources;

a plurality of current sources each for providing a level of current responsive to a control signal;

a plurality of switches each selectively connecting one of said plurality of laser beam sources to a respective one of said plurality of current sources;

a plurality of control means each for controlling a respective one of said plurality of laser beam sources by comparing the detection signal output by said photodetector with a reference signal and outputting the control signal to a respective one of said plurality of current sources, the control signal being indicative of a difference in magnitude between the detection signal and the reference signal;

a plurality of sample-and-hold circuits each respectively interposed between said photodetector and one of said plurality of control means; and timing adjustment means for outputting a plurality of timing signals of a first type for controlling said plurality of switches and a plurality of timing signals of a second type for controlling said plurality of sample-and-hold circuits, wherein said timing adjustment means outputs the plurality of timing signals of the first type for time-divisionally turning on said plurality of switches and sequentially making said plurality of laser beam sources emit the laser beams one by one, said timing adjustment means outputs the plurality of timing signals of the second type making each of said plurality of sample-and-hold circuits sample while a corresponding one of said plurality of switches is on, and said timing adjustment means outputs the plurality of timing signals of the second type making each of said plurality of sample-and-hold circuits sample while any one of said switches which are turned on before the corresponding switch is on.

2. An image forming apparatus comprising:

a plurality of laser beam sources selectively emitting laser beams;

a photodetector for producing a detection signal indicative of an amount of light of the laser beams emitted from said plurality of laser beam sources;

a plurality of current sources each for providing a level of current responsive to a control signal;

a plurality of switches each selectively connecting one of said plurality of laser beam sources to a respective one of said plurality of current sources;

a plurality of control means each for controlling a respective one of said plurality of laser beam sources by comparing the detection signal output by said photodetector with a reference signal and outputting the control signal to a respective one of said plurality of current sources, the control signal being indicative of a difference in magnitude between the detection signal and the reference signal;

a plurality of sample-and-hold circuits each respectively interposed between said photodetector and one of said plurality of control means;

timing adjustment means for outputting a plurality of timing signals of a first type for controlling said plurality of switches and a plurality of timing signals of a second type for controlling said plurality of sample-and-hold circuits, wherein said timing adjustment means outputs the plurality of timing signals of the first type for time-divisionally turning on said plurality of switches and sequentially making said plurality of laser beam sources emit the laser beams one by one, said timing adjustment means outputs the plurality of timing signals of the second type making each of said plurality of sample-and-hold circuits sample while a corresponding one of said plurality of switches is on, and said timing adjustment means outputs the plurality of timing signals of the second type making each of said plurality of sample-and-hold circuits sample while any one of said switches which are turned on before the corresponding switch is on;

scanning means for scanning the plurality of laser beams from said semiconductor laser beam source; and a photoconductive image carrier on which an image is formed by the scanned plurality of laser beams.

3. A copying machine comprising a plurality of laser beam sources selectively emitting laser beams;

a photodetector for producing a detection signal indicative of an amount of light of the laser beams emitted from said plurality of laser beam sources;

a plurality of current sources each for providing a level of current responsive to a control signal;

a plurality of switches each selectively connecting one of said plurality of laser beam sources to a respective one of said plurality of current sources;

a plurality of control means each for controlling a respective one of said plurality of laser beam sources by comparing the detection signal output by said photodetector with a reference signal and outputting the control signal to a respective one of said plurality of current sources, the control signal being indicative of a difference in magnitude between the detection signal and the reference signal;

a plurality of sample-and-hold circuits each respectively interposed between said photodetector and one of said plurality of control means; and timing adjustment means for outputting a plurality of timing signals of a first type for controlling said plurality of switches and a plurality of timing signals of a second type for controlling said plurality of sample-and-hold circuits, wherein said timing adjustment means outputs the plurality of timing signals of the first type for time-divisionally turning on said plurality of switches and sequentially making said plurality of laser beam sources emit the laser beams one by one, said timing adjustment means outputs the plurality of timing signals of the second type making each of said plurality of sample-and-hold circuits sample while a corresponding one of said plurality of switches is on, and said timing adjustment means outputs the plurality of timing signals of the second type making each of said plurality of sample-and-hold circuits sample while any one of said switches which are turned on before the corresponding switch is on;

scanning means for scanning the plurality of laser beams from said semiconductor laser beam source; and a photoconductive image carrier on which an image is formed by the scanned plurality of laser beams.

4. A laser beam source control apparatus comprising:

a semiconductor laser beam source having a plurality of light-emitting portions;

light amount detection means for detecting amounts of light emitted by said light-emitting portions and outputting a detection signal indicative of the amounts of light, respectively; and light amount adjustment means for outputting a control voltage for controlling currents respectively supplied to each of said light-emitting portions, said light amount adjustment means controlling the currents so as to bring the detection signal from said light amount detection means closer to a target level, said light amount adjustment means sequentially performing light amount adjustment for each of said light-emitting portions using the control voltage obtained when light amount adjustment is performed for a given light-emitting portion as a control start voltage for subsequent light amount adjustment for other light-emitting portions.

5. A method of adjusting light amounts of a plurality of light-emitting portions of a semiconductor laser beam source, comprising the steps of:

providing a semiconductor laser beam source having a plurality of light-emitting portions; and sequentially performing light amount adjustment for said light-emitting portions, using a control voltage obtained when light amount adjustment is performed for a given light-emitting portion as a control start voltage for subsequent light amount adjustment for other light-emitting portions.

6. An image forming apparatus comprising:

a semiconductor laser beam source having a plurality of light-emitting portions;

light amount detection means for detecting amounts of light emitted by said light-emitting portions and outputting detection signal indicative of the amounts of light, respectively;

light amount adjustment means for outputting a control voltage for controlling currents respectively supplied to each of said light-emitting portions, said light amount adjustment means controlling the currents so as to bring the detection signal from said light amount detection means closer to a target level, said light amount adjustment means sequentially performing light amount adjustment for each of said light-emitting portions using the control voltage obtained when light amount adjustment is performed for a given light-emitting portion as a control start voltage for subsequent light amount adjustment for other light-emitting portions;

scanning means for scanning a plurality of laser beams from said semiconductor laser beam source; and a photoconductive image carrier on which an image is formed by the scanned plurality of laser beams.

7. A laser beam source control apparatus comprising:

a semiconductor laser beam source having a plurality of light-emitting portions;

light amount detection means for detecting amounts of light emitted by said light-emitting portions and outputting detection signal indicative of the amounts of light, respectively; and light amount adjustment means for outputting a control voltage for controlling currents respectively supplied to each of said light-emitting portions, said light amount adjustment means controlling the currents so as to bring the detection signal from said light amount detection means closer to a target level, said light amount adjustment means sequentially performing light amount adjustment for each of said light-emitting portions, respectively, and obtaining a control start voltage while light amount adjustment is performed for a given light-emitting portion, the control start voltage being used for subsequent light amount adjustment for other light-emitting portions.

8. A method of adjusting light amounts of a plurality of light-emitting portions of a semiconductor laser beam source, comprising the steps of:
providing a semiconductor laser beam source having a plurality of light-emitting portions;
sequentially performing light amount adjustment for said light-emitting portions, respectively; and
obtaining a control start voltage while light amount adjustment is performed for a given light-emitting portion, and using the control start voltage for subsequent light amount adjustment for other light-emitting portions.

9. An image forming apparatus comprising:
a semiconductor laser beam source having a plurality of light-emitting portions;
light amount detection means for detecting amounts of light emitted by said light-emitting portions and outputting detection signal indicative of the amounts of light, respectively;
light amount adjustment means for outputting a control voltage for controlling currents respectively supplied to each of said light-emitting portions, said light amount adjustment means controlling the currents so as to bring the detection signal from said light amount detection means closer to a target level, said light amount adjustment means sequentially performing light amount adjustment for each of said light-emitting portions, respectively, and obtaining a control start voltage while light amount adjustment is performed for a given light-emitting portion, the control start voltage being used for subsequent light amount adjustment for other light-emitting portions;
scanning means for scanning a plurality of laser beams from said semiconductor laser beam source; and
a photoconductive image carrier on which an image is formed by the scanned plurality of laser beams.

10. A laser driving apparatus comprising:
a first laser light source;
a second laser light source;
a first power source for supplying said first laser light source with electric power;
a second power source for supplying said second laser light with electric power;
a first switch provided between said first laser light source and said first power source to electrically connect or disconnect said first laser light source and said first power source;
a second switch provided between said second laser light source and said second power source to electrically connect said second laser light source and said second power source;
a light-receiving portion for receiving light from said first laser light source and light from said second laser light source;
a first sample-and-hold circuit for sampling or holding a first output signal indicative of an amount of light detected by said light-receiving portion;
a second sample-and-hold circuit for sampling or holding a second output signal indicative of an amount of light received by said light-receiving portion;
first control means for controlling said first power source by comparing said first output signal from said first sample-and-hold circuit with a first reference value and outputting a first voltage;
a second control means for controlling said second power source by comparing said second output signal from said second sample-and-hold circuit with a second reference value and outputting a second voltage; and
timing adjustment means for outputting a first switch timing signal for controlling said first switch, a second switch timing signal for controlling said second switch, a first sample-and-hold signal for controlling a sampling operation or a holding operation of said first sample-and-hold circuit, and a second sample-and-hold signal for controlling a sampling operation or a holding operation of said second sample-and-hold circuit,
wherein said timing adjustment means is capable of controlling such that said second sample-and-hold circuit is set in a sampling state by said second sample-and-hold signal and said second switch is set to a disconnecting state by said second switch timing signal while said first sample-and-hold circuit is set to a sampling state by said first sample-and-hold signal.

11. An image forming apparatus comprising:
the laser driving apparatus according to claim 10;
scanning means for scanning laser beams emitted from said first and second laser light source; and
a recording medium which is adapted to be exposed by each of said laser beams.

12. A laser driving method comprising the steps of:
providing a laser driving apparatus which comprises:
a first laser light source;
a second laser light source;
a first power source for supplying said first laser light source with electric power;
a second power source for supplying said second laser light source with electric power;
a first switch provided between said first laser light source and said first power source to electrically connect or disconnect said first laser light source and said first power source;
a second switch provided between said second laser light source and said second power source to electrically connect or disconnect said second laser light source and said second power source;
a light-receiving portion for receiving light from said first laser light source and light from said second laser light source;
a first sample-and-hold circuit for sampling or holding a first output signal indicative of an amount of light detected by said light-receiving portion;
a second sample-and-hold circuit for sampling or holding a second output signal indicative of an amount of light received by said light-receiving portion;
first control means for controlling said first power source by comparing said first output signal from said first sample-and-hold circuit with a first reference value and outputting a first voltage;
second control means for controlling said second power source by comparing said second output signal from said second sample-and-hold circuit with a second reference value and outputting a second voltage; and
timing adjustment means for outputting a first switch timing signal for controlling said first switch, a second switch timing signal for controlling said second switch, a first sample-and-hold signal for controlling a sampling operation or a holding operation of said first sample-and-hold circuit, and a second sample-and-hold signal for controlling a sampling operation or a holding operation of said second sample-and-hold circuit; and controlling, by said timing adjustment means, to set said second sample-and-hold circuit to a sampling state by said second sample-and-hold signal and to set said second switch to a disconnecting state by said second switch timing signal while setting said first sample-and-hold circuit to a sampling state by said first sample-and-hold signal.

* * * * *

UNITED STATES PATENT AND TRADEMARK OFFICE
CERTIFICATE OF CORRECTION

PATENT NO. : 6,144,680
DATED : November 7, 2000
INVENTOR(S) : Hajime Kaji et al.

It is certified that error appears in the above-identified patent and that said Letters Patent is hereby corrected as shown below:

Column 4,
Line 14, "an" should read -- and --; and
Line 48, "$VH_2$" should read -- $V_{H2}$ --.

Column 5,
Line 62, "signal;" should read -- signal --.

Column 6,
Line 56, "means;" should read -- means; and --.

Column 7,
Line 15, "comprising" should read -- comprising: --.

Column 9,
Line 54, "connect said" should read -- connect or disconnect said --.

Column 10,
Line 3, "a" should be deleted.

Signed and Sealed this

Twenty-first Day of June, 2005

JON W. DUDAS
*Director of the United States Patent and Trademark Office*